United States Patent [19]

Itakura

[11] Patent Number: 4,748,408
[45] Date of Patent: May 31, 1988

[54] METHOD AND APPARATUS FOR PROVIDING DIRECTION-INDICATIVE OUTPUT SIGNALS TO THE INTEGRATING AMPLIFIER OF A DEVICE FOR DETECTING MAGNETIC DIRECTION

[75] Inventor: Toshio Itakura, Saitama, Japan

[73] Assignee: Hitachi Metals, Ltd., Tokyo, Japan

[21] Appl. No.: 782,419

[22] Filed: Oct. 1, 1985

[30] Foreign Application Priority Data

Oct. 1, 1984 [JP] Japan ................ 59-205955

[51] Int. Cl.⁴ .......................................... G01R 33/04
[52] U.S. Cl. .................................................. 324/255
[58] Field of Search ................ 324/244, 253–255, 324/260–262; 33/361, 362, 355 R

[56] References Cited

U.S. PATENT DOCUMENTS

| | | | |
|---|---|---|---|
| 2,942,180 | 6/1960 | Coker | 324/255 |
| 3,490,035 | 1/1970 | Hart et al. | 324/253 |
| 3,509,424 | 4/1970 | Inouye | 324/254 X |
| 3,638,074 | 1/1972 | Inouye | 324/254 X |
| 4,262,427 | 4/1981 | Lynch et al. | 324/260 X |
| 4,480,226 | 10/1984 | Kuno et al. | 324/253 X |
| 4,497,034 | 1/1985 | Kuno et al. | 324/253 X |
| 4,503,395 | 3/1985 | Kuatzer et al. | 324/253 |

FOREIGN PATENT DOCUMENTS

| | | |
|---|---|---|
| 50-72656 | 6/1975 | Japan . |
| 54-21889 | 2/1979 | Japan . |
| 55-54402 | 4/1980 | Japan . |
| 56-43013 | 4/1981 | Japan . |
| 146108 | 8/1985 | Japan . |
| 165510 | 8/1985 | Japan . |

OTHER PUBLICATIONS

IEEE Transactions on Geoscience Electronics, vol. GE-7, No. 45, pp. 252–260, Oct. 1969, Acuna et al, "A Miniature Two-Axis Fluxgate Magnetometer."

*Primary Examiner*—Reinhard J. Eisenzopf
*Assistant Examiner*—Warren S. Edmonds
*Attorney, Agent, or Firm*—Finnegan, Henderson, Farabow, Garrett and Dunner

[57] ABSTRACT

A magnetic direction detecting apparatus has a magnetic sensor head composed of a magnetic core, an exciting coil wound around the core and a pair of detection coils diametrically wound around the core perpendicularly to each other; an oscillator for supplying a rectangular current wave of a single polarity to the exciting coil; and a switching gate openable synchronously with the rectangular wave for permitting only peaks of the same polarity to pass therethrough. The detection of a magnetic direction by using this apparatus does not suffer from restrictions in switching gate-opening timing.

8 Claims, 4 Drawing Sheets

METHOD AND APPARATUS FOR PROVIDING DIRECTION-INDICATIVE OUTPUT SIGNALS TO THE INTEGRATING AMPLIFIER OF A DEVICE FOR DETECTING MAGNETIC DIRECTION

FIELD OF THE INVENTION

The present invention relates to a method and an apparatus for detecting the direction of a magnetic field. More specifically, it relates to a method and an apparatus for detecting the direction of a magnetic field by using a sensor head composed of a magnetic core, an exciting coil wound around the core and detection coils diametrically wound around the core.

BACKGROUND OF THE INVENTION

Recently, a system generally referred to as a "trip computer" has been gathering attention in the automobile industry. A trip computer gives a driver information concerning vehicle's velocity, and direction and distance to destination. As trip computers have been applied to various practiced uses, in particular attention has been focused on direction sensors for knowing the directions of moving vehicles. Thus, various proposals have been made in connection with the structure of trip computers as such structure relates to direction sensing. Mario H. Acuna et al. proposed a dual-axis flux gate magnetic sensor in *IEEE Transactions on Geoscience Electronics* Vol. GE-7, No. 4 pp. 252-260, October 1969. This sensor comprises an annular magnetic core, an exciting coil wound around the core and a pair of detection coils wound around the core perpendicularly to each other. An alternating current is supplied to the exciting coil.

How such magnetic direction sensor works will be explained referring to FIG. 4 which schematically shows a magnetic direction sensor head. When an alternating current i is supplied to exciting coil 2 wound around annular magnetic core 1, a magnetic field is excited or induced in the core 2. Detection coil 3 is used for detecting the direction of the induced magnetic field. In detection coil 3, a magnetic field Hi, of a given strength shown by the upward arrow is generated on side A, while a magnetic field Hi having the same given strength, shown by the downward arrow is generated on the opposite side B. Since the magnetic fields on side A and opposite side B are of the same strength, but of opposite direction, the magnetic fields offset each other, and therefore there is no net magnetic flux penetrating the detection coil 3 unless there is an external magnetic field. If there is an external magnetic field Ho, the detection coil 3 is subjected at side A and opposite side B to magnetic fields HA and HB which are respectively expressed by the following equations (assuming the upward direction positive):

$$HA = Hi - Ho$$

$$HB = -Hi - Ho.$$

These magnetic fields produce magnetic fluxes $\phi A$ and $\phi B$ which penetrate the detection coil 3 at A and B, respectively:

$$\phi A = F(HA) = F(Hi - Ho)$$

$$\phi B = F(HB) = -F(Hi + Ho)$$

The magnetic fluxes $\phi A$ and $\phi B$ and the exciting magnetic field Hi have a relationship as shown in FIG. 5. For the sake of simplicity, $\phi$—Hi hysteresis curves are shown by parallelograms. It is noted that a $\phi A$—Hi curve and a $\phi B$—Hi curve are the same in shape; that they are shifted away from the origin by the value of Ho in the positive and negative directions, respectively, and that the $\phi B$—Hi curve is turned upside down with respect to the abscissa Hi.

The total magnetic flux $\phi$ penetrating the detection coil 3 is a sum of $\phi A$ and $\phi B$. Thus, when Hi varies from a sufficiently large minus level to a sufficiently large plus level and then returns to the minus level, the total magnetic flux $\phi$ changes in a manner shown by the lines I and II in FIG. 6(a). It should be noted that since Hi varies constantly in terms of time, the abscissa of FIG. 6(a) represents time (t).

The output v of the detection coil is shown by the following equation:

$$v \propto -d\phi(t)/dt$$

Since $\phi$ is a fucntion of time, the output v also varies as a function of time in a manner as schematically shown in FIG. 6(b).

Japanese Patent Laid-Open No. 54-21889 discloses an apparatus for detecting the direction of a magnetic field from the outputs of detection coils. In this apparatus, the outputs pass through a band-pass filter the central frequency of which is two times as large as the frequency f of an exciting current, then an amplifier, and further a synchronous rectifier to convert it into a DC voltage which is sent to a display. A source of the exciting current is connected to a frequency multiplier to send a signal of frequency 2f to the synchronous rectifier through which only either of positive or negative peaks in the output signal can pass.

As a matter of fact, even if an input voltage supplied to the exciting coil 2 in FIG. 4 is precisely in the form of a reactangular wave varying between plus and minus, a current i flowing in the coil 2 has a wave form as shown in FIG. 7(a) which has pulses which have shoulders 5 and 6 at both leading and trailing edges of the pulses. The reason the pulses of the rectangular wave have shoulders is that the magnetic core 1 has a permeability $\mu$ which varies along a B—H hysteresis curve, whereby the exciting coil's impedance jwL also changes substantially along the hysteresis curve. Thus, the output voltage v varies in a manner as shown in FIG. 7(b).

The output voltage v passes through a filter to eliminate either of positive or negative peaks thereof. For instance, in FIG. 7(b), the negative peaks 7', 8' are cut to permit only the positive peaks 7, 8 to pass. For this purpose, a gate is opened at constant intervals ($t_1 \rightarrow t_2$, $t_3 \rightarrow t_4$) synchronously with the leading and trailing edges of the rectangular input voltage.

However, since the output signal shows a pair of positive and negative peaks at each of the leading and trailing edges of the input voltage, a signal for opening the gate should have a frequency which is just twice as high as the frequency f of the current supplied to the exciting coil. This necessitates a circuit which supplies a signal of frequency 2f synchronously with an oscillator for the exciting coil. This in turn makes a driving circuit of the direction sensor rather complicated.

In addition, since positive and negative peaks 7, 7', 8, 8' of the output signal are close to each other, the timing of opening and shutting the gate should be extremely precise. Moreover, since the width of shoulders 5, 6 may vary depending on the material and shape of the magnetic core, the setting of the intervals $t_1 \to t_2$ and $t_3 \to t_4$ during which the gate is open results in there being restrictions in materials and designs of the magnetic core. On the other hand, once the magnetic core's material and design is given, the timing of opening and shutting the gate is restricted accordingly.

Furthermore, since the permeability $\mu$ of the magnetic core varies with the temperature, the width of the shoulders 5, 6 also changes depending on temperature conditions. Thus, avoidance of any errors due to temperature variations requires further precision in gate-opening timing.

OBJECT AND SUMMARY OF THE INVENTION

An object of the present invention is, therefore, to provide a method and an apparatus for detecting the direction of a magnetic field without any of the above-mentioned problems.

More specifically, it is to provide a method and apparatus for detecting the direction of a magnetic field, which is capable of providing an output signal having only either of positive or negative peaks without necessitating a complicated sensor driving circuit.

A method for detecting the direction of a magnetic field according to the present invention uses a magnetic sensor head comprising a looped magnetic core, an exciting coil wound around the magnetic core, and a plurality of detection coils wound diametrically around the core and crossing each other at a certain angle. Its driving method comprises sending an input current in the form of a rectangular wave of a single polarity to the exciting coil, generating in each detection coil an output signal having peaks of opposite polarities corresponding to the leading and trailing edges of the rectangular wave, passing the output signal through a switching gate which is opened synchronously with the rectangular wave, thereby providing only the peaks of either one polarity.

A magnetic direction sensor for performing the above method according to the present invention comprises an oscillator for sending an input current in the form of a rectangular wave having a single plurality to an exciting coil of a sensor head, and a switching gate which receives an output signal having peaks of opposite polarities corresponding to the leading and trailing edges of the rectangular input current wave from each detection coil, and is opened so as to pass only the peaks of either one polarity therethrough synchronously with the input signal.

DESCRIPTION OF THE PREFERRED EMBODIMENTS

Figure 1:
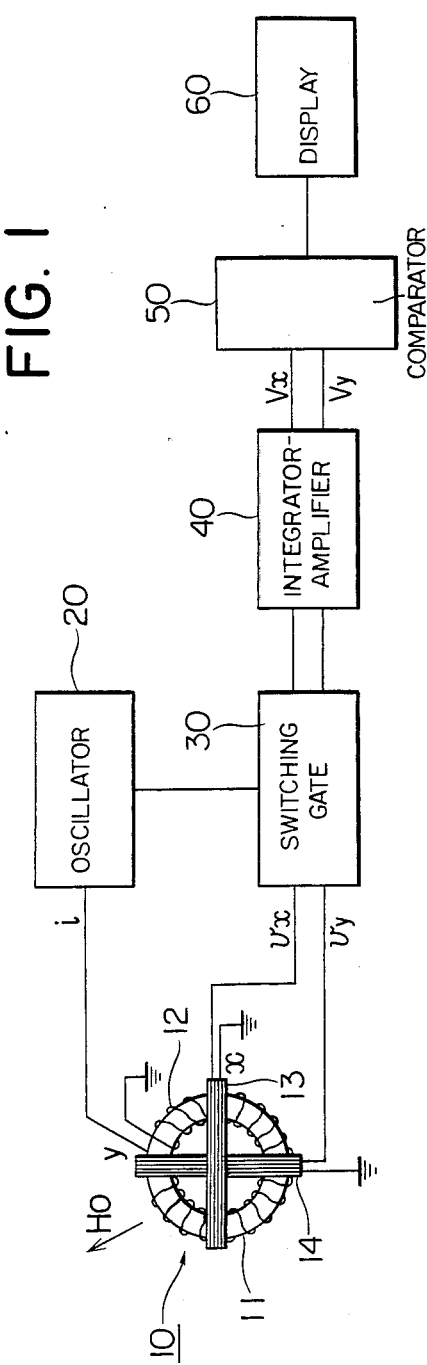
FIG. 1 is a schematic view of a magnetic direction detecting apparatus according to one embodiment of the present invention.

The looped magnetic core is preferably annular but it may be square. The magnetic core may be prepared from any materials having high permeability. The preferred materials include ferrites, permalloys and amorphous alloys. Since the amorphous alloys have magnetic characteristics which are not substantially affected by vibration and impact, they are particularly preferable. The amorphous alloys are usually in the form of ribbons and wound into a toroidal shape, but the cores may also be formed by punching out rings from amorphous sheets and laminating them.

The exciting coil is formed on a part or on the whole length of the magnetic core. To ensure that a vibrating magnetic field is generated uniformly throughout the magnetic core, uniform winding of a wire around the whole annular length of the magnetic core is desirable.

Detection coils are wound across the magnetic coil. A pair of detection coils are preferably wound across the magnetic coil such that the coils are perpendicular to each other and intersect at the center of the magnetic coil. Where the magnetic coil used is annular, three or more detection coils may be used, with the detection coils wound so that the detection coils intersect at the center of the magnetic coil so that the same angular spacing exists between the detection coils.

The input voltage which the oscillator supplies to the exciting coil is in the form of a rectangular wave having a single polarity. The term "rectangular wave" means that transition between low and high levels in the input voltage takes place quickly enough to ensure that sufficiently large output singals are provided by the detection coils. Therefore, the leading and trailing edges of the rectangular wave may be slightly slanted or curved as long as the above requirement is met. Also, the term "single polarity" means that the lowest or highest level of the rectangular wave coincides with a ground level; in other words, every rectangular peak of the wave is either positive or negative.

Further referring to the drawings, the present invention will be explained in detail.

FIG. 1 shows schematically a magnetic direction sensor according to one embodiment of the present invention. A sensor head 10 comprises an exciting magnetic core 11, a coil 12 wound around the magnetic core 11 for magnetically exciting magnetic core 11, a pair of detection coils 13 and 14 which are wound around the magnetic core 11 in such a manner that detection coils 13 and 14 cross perpendicularly to each other. Assume that one detection coil 13 is along an X-axis and another detection coil 14 is along a Y-axis.

Figure 2:
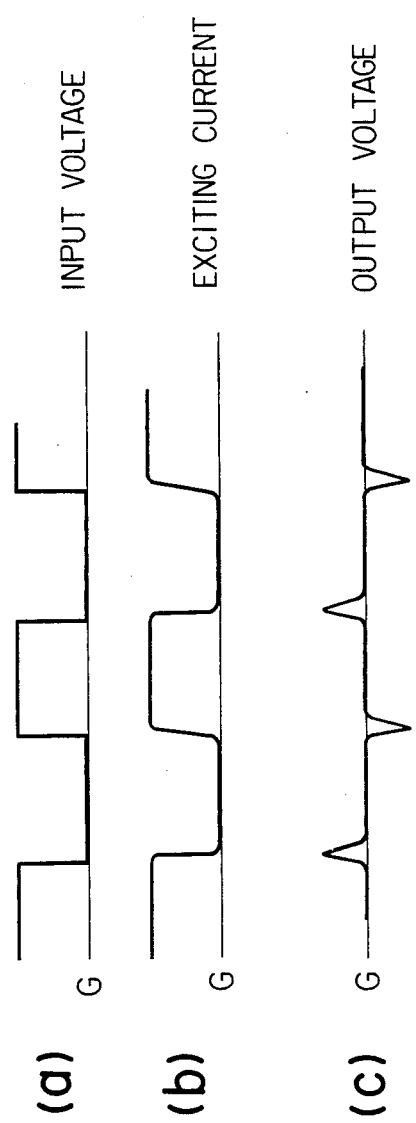
FIG. 2 is a view showing the relationships between an input voltage, an exciting current and an output voltage obtained utilizing the method and apparatus of the present invention.

Oscillator 20 is connected to the exciting coil 12 for supplying to exciting coil 12 an input signal i which is an input voltage in the form of a rectangular wave having a single polarity. The oscillator 20 is also connected to a switching gate 30. Oscillator 20 is also used for sending a signal synchronized with the rectangular wave to switching gate 30. In this embodiment, the signal i or rectangular wave input to excitation coil 12 is as shown in FIG. 2(a), having leading edges starting from a ground level and trailing edges ending at the ground level. The synchronized signal from oscillator 20 may be synchronized with either of the leading or trailing edge of the signal i rectangular wave input to excitation coil 12. If the gate-opening signal is synchronized with the trailing edge of the rectangular wave, an appropriate delay circuit should be provided between the oscillator 20 and the switching gate 30.

Figure 7:
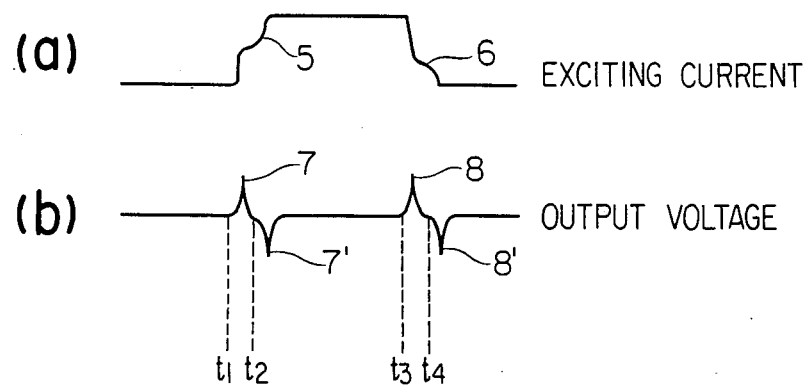
FIG. 7 is a view showing the actual wave forms of an exciting current and an output voltage when an alternating input voltage is applied to an exciting coil of a conventional magnetic direction detecting apparatus.

The input voltage of a single polarity from the oscillator 20 as shown in FIG. 2(a) generates in the exciting coil 12 an exciting current in a wave form as shown in FIG. 2(b). Contrary to the conventional exciting current shown in FIG. 7(a), the excitation current passing through excitation coil 12 of the present invention has no shoulders on either the leading or trailing edges of the pulses of the excitation waveform. The reason for this is that the input voltage varies not from minus to plus, but rather varies only in either the plus or the minus region. Due to this characteristic of the exciting current, there appears an output voltage v in a wave form as shown in FIG. 2(c) in the detection coils 13, 14. It is to be noted that the output voltage has peaks, a pair of which are of the opposite polarities, positive and negative, each corresponding to the leading and trailing edges of the rectangular wave. Contrary to the conventional output signal shown in FIG. 7(b), it is an outstanding feature of the present invention that the output signal has only one peak at each of the leading and trailing edges. Since the positive and negative peaks are fully separated from each other, what is necessary to pick up useful peaks is only to synchronize the timing of opening the switching gate 30 through which the output signal is supposed to pass, with each leading or trailing edge of the reacangular wave. Accordingly, the gate-opening timing is not restricted by the magnetic characteristics of the sensor head.

The switching gate which receives the outputs Vx and Vy from detection coils 13 and 14 is opened and shut by a signal which is synchronized with the leading or trailing edge of the rectangular input voltage supplied by the oscillator 20. In the preferred embodiment, the switching gate 30 is opened synchronously with the leading edge of the rectangular wave.

The output signal, having only peaks of either positive or negative polarity passing through the switching gate 30, is supplied to integrator-amplifier 40 where it is converted to a DC voltage. The integrator-amplifier 40 per se may be a conventional one. The DC voltage or signal of integrator-amplifier 40 is provided to comparator 50 which compares the DC signal against an internal reference signal of comparator 50 to determine the direction of an external magnetic field. The output of the comparator 50 is sent to display 60 which indicates directions such as east, west, north and south. The direction indication may be step-wide, for instance, in 8, 12 or 16 directions, or it may be a continuous indication by a meter, a liquid-crystal display, etc. The comparator 50 and the display 60 may also be conventional ones. See, for instance, Japenese Patent Laid-Open Nos. 50-72656 and 55-54402 and Japanese Utility Model Laid-Open No. 56-43013. Those filed by the applicant (Japanese Patent Laid-Open Nos. 59-3124 and 59-21440) may also be used.

Figure 3:
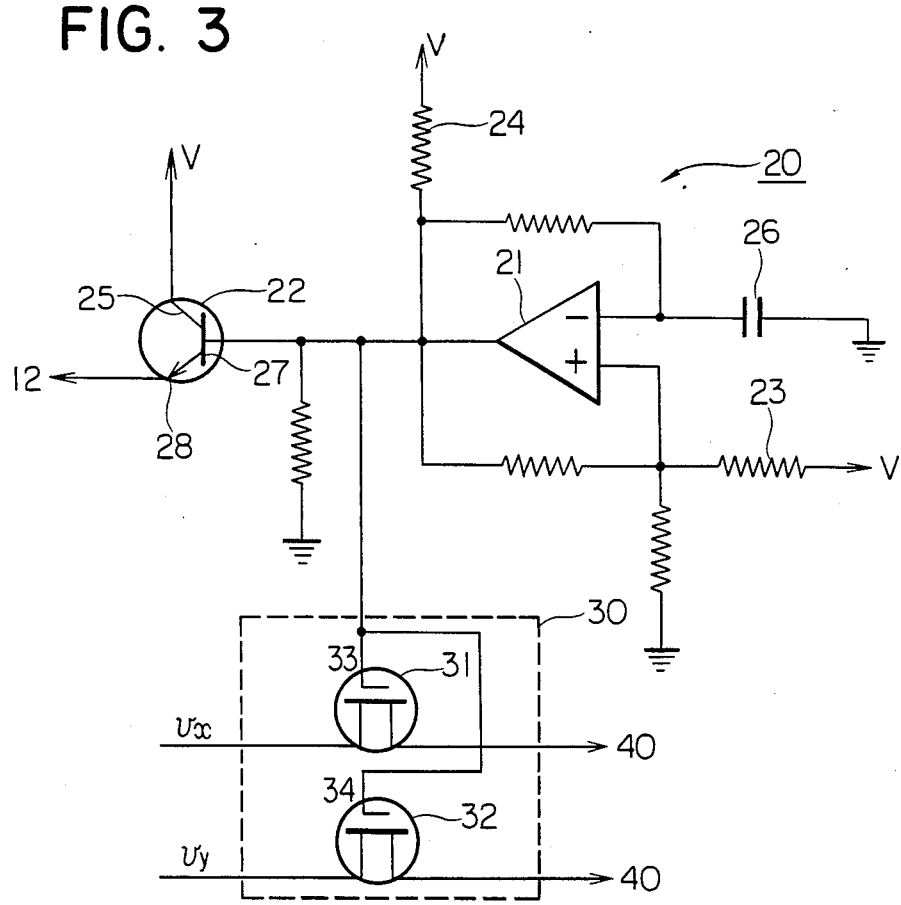
FIG. 3 is a schematic view showing an oscillator and a switching gate according to one embodiment of the present invention.
Figure 4:
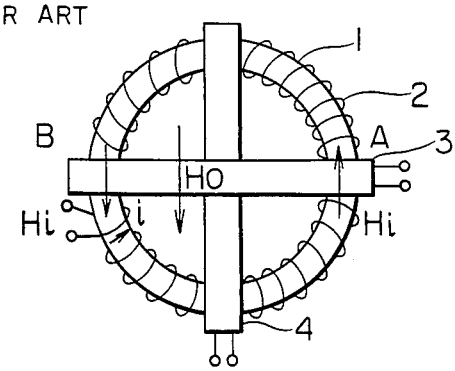
FIG. 4 is a schematic view showing a magnetic sensor head of the type generally used in magnetic direction sensors.
Figure 5:
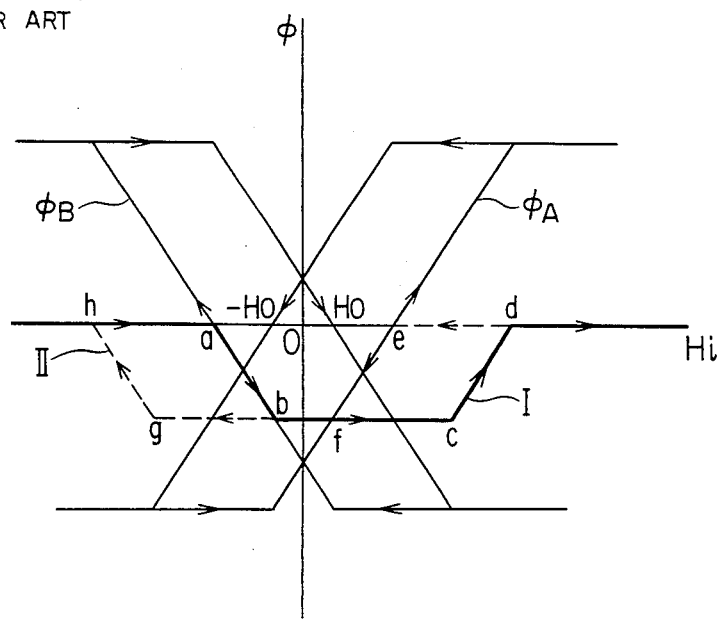
FIG. 5 is a schematic view showing the relationship between an alternating magnetic field and magnetic fluxes penetrating the detection coil for a conventional magnetic direction detecting apparatus.
Figure 6:
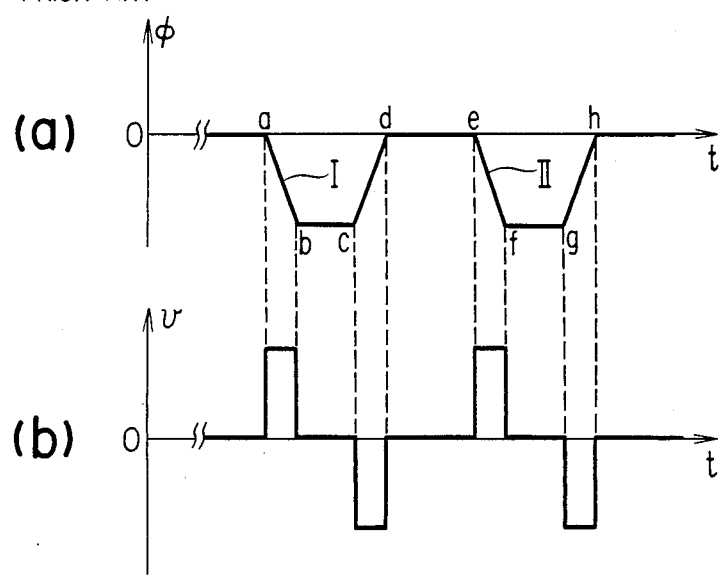
FIG. 6 is a view showing the relationship between the magnetic flux of FIG. 5 and an output signal.

FIG. 3 schematically shows the structures of the oscillator 20 and the switcing gate 30.

The oscillator 20 has comparator 21 and transistor 22. A source voltage V is applied to resistors 23, 24 and collector 25 of transistor 22. Since the minus input terminal of comparator 21 is grounded via capacitor 26, there appears a difference between voltages at plus and minus input terminals, whereby the comparator 21 supplies intermittent output. When the output of the comparator 21 is supplied to the base 27 of the transistor 22, there appears an output from emitter 28. The emitter 28 is connected to the exciting coil 12 of the magnetic sensor head 10. Thus, the exciting coil 12 receives an input of rectangular wave. The output of the comparator 21 is also sent to the switching gate 30 as a signal for opening it.

The switching gate 30 is preferably of an FET structure. In the preferred embodiment, the output of the comparator 21 in the oscillator 20 is directly supplied to gates 33, 34 of the FETs 31, 32. In general, FETs are faster than junction-type transistors (npn or pnp). Accordingly, in the case of structure as shown by FIG. 3, after the FETs 31, 32 are made conductive by the output of the comparator 21, there appears an output on the emitter 28 of the transistor 22, and after the FETs 31, 32 are shut by the termination of the output of the comparator 21, the output of the emitter 28 of the transistor 22 is ended. Due to such difference in operation speed, direct supply of the output of the comparator 21 to the FET gates in the switching gate 30 makes it possible to obtain output voltage having only peaks of either one of the positive and negative polarities synchronously with the leading edge of the rectangular wave without fail. This does not necessitate any additional circuits, which is a great advantage of the present invention.

Figure 8:
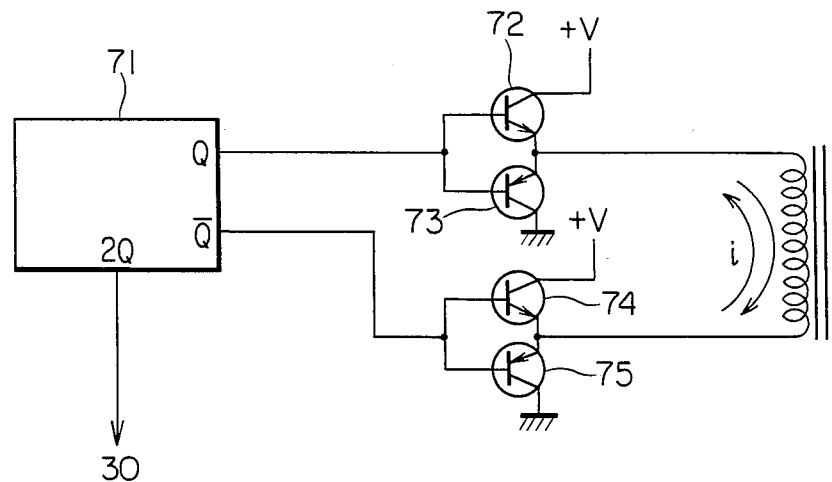
FIG. 8 is a view showing one example of an oscillator which supplies an alternating input voltage to a conventional magnetic direction detecting apparatus.

Since what the oscillator has to do in the present invention is only to supply a rectangular wave of a single polarity, the oscillator's structure may be rather simple. On the other hand, if it needs to supply an alternating current like in the conventional art, the oscillator would have to have a complicated structure. One example of a complicated oscillator structure for use in connection with conventional magnetic direction detectors comprises flip-flop 71 and four transistors 72-75 operated by the output of the flip-flop as shown in FIG. 8.

The present invention has been explained referring to the drawings, but it should be noted that the present invention is not restricted to those shown by the drawings and that any modification and alteration may be added thereto within its spirit and scope.

It may be appreciated that the present invention has the following effects:

(1) Since the exciting current supplied to the exciting coil is a rectangular wave of a single polarity, each detection coil provides an output signal having peaks of positive and negative polarities respectively corresponding to the leading and trailing edges of the rectangular wave.

(2) Althought the timing of opening a switching gate is restricted by the magnetic characteristics of a sensor head, or the sensor head is required to have particular magnetic characteristics required by the switching gate timing in the conventional sensor using an alternating exciting current, there is not such restriction or requirement in the present invention.

(3) Where FETs are used in a switching gate, the output of a comparator in the oscillator may be used directly as a gate-opening signal.

(4) Since the oscillator needs only to supply a rectangular wave of a single polarity, its structure may be simple.

(5) Since the rectangular wave of a single polarity is used, less electric power is consumed than when an alternating current is used.

What is claimed is:

1. A method for providing output signals indicative of a direction of a magnetic field to an integrating amplifier of an apparatus for detecting the direction of a magnetic field having a magnetic sensor head comprising a looped magnetic core, an excitation coil wound around the looped magnetic core for magnetically exciting the magnetic core, and a plurality of detection coils diametrically wound around the looped magnetic core in such a manner that the detection coils cross each other at a predetermined angle, the method comprising the steps of:
    (a) supplying a current in the form of a rectangular wave of a single polarity to the excitation coil, the rectangular wave comprising pulses each having a leading edge and a trailing edge;
    (b) generating, in response to the rectangular wave, detection coil output signals having peaks, the peaks having negative and positive polarity corresponding to the leading edge and the trailing edge of each pulse of the rectangular wave, respectively; and
    (c) synchronously transferring detection coil output signal peaks of a single polarity through a switching gate to the integrating amplifier, the switching gate being opened synchronously with a selected edge of the pulses of the rectangular wave to transfer the single polarity peaks of the detection coil output signals.

2. The method for providing output signals indicative of a direction of a magnetic field to an integrating amplifier of an apparatus for detecting the direction of a magnetic field according to claim 1, wherein said method is performed using an annular magnetic core, and a pair of detection coils which are perpendicular to each other.

3. The method for providing output signals indicative of a direction of a magnetic field to an integrating amplifier of an apparatus for detecting the direction of a magnetic field according to claim 1, wherein detection coil output signal peaks of a single selected polarity are synchronously transferred through the switching gate, the switching gate being opened synchronously with the leading edge of the pulses of the rectangular wave.

4. Apparatus used in a magnetic field direction detecting device, for providing output signals indicative of a direction of a magnetic field to an integrating amplifier of the magnetic field direction detecting device, the apparatus for providing the output signals comprising:
    (a) a magnetic sensor head comprising a looped magnetic core, an excitation coil wound around said looped magnetic core and carrying an input current operative to magnetically excite said looped magnetic core, and a plurality of detection coils diametrically wound around said looped magnetic core in such a manner that said detection coils cross each other at a predetermined angle;
    (b) an oscillator for supplying said input current in the form of a rectangular wave of a single polarity, comprising pulses each having a leading edge and a trailing edge, to said excitation coil of said magnetic sensor head to magnetically excite said looped magnetic core and to thereby generate output signals having peaks in said detection coils, said output signals having peaks of negative and positive polarity corresponding to said leading edge and said trailing edge of each of said pulses of said rectangular wave, respectively; and
    (c) a switching gate, connected to said detection coils, said oscillator and said integrating amplifier, for synchronously transferring output signal peaks of a single predetermined polarity from said detection coils to said integrating amplifier when said switching gate is opened, said switching gate being opened in response to a selected edge of said pulses of said rectangular wave to transfer said single polarity peaks of said output signals.

5. The apparatus for providing output signals indicative of a direction of a magnetic field to an integrating amplifier of a magnetic direction detecting device according to claim 4, wherein said looped magnetic core is annular, and said detection coils are a pair of detection coils perpendicular to each other.

6. The apparatus for providing output signals indicative of a direction of a magnetic field to an integrating amplifier of a magnetic direction detecting device according to claim 4, wherein said switching gate is opened synchronously with said leading edge of said pulses of said rectangular wave to transfer peaks of a single predetermined polarity from said detection coils to said integrating amplifier.

7. The apparatus for providing output signals indicative of a direction of a magnetic field to an integrating amplifier of a magnetic direction detecting device according to claim 4, wherein said oscillator comprises a comparator providing an output, and a junction-type transistor having a base and an emitter, output of said comparator output being supplied to said base of said transistor, and wherein said emitter of said transistor is operative to provide said input current to said excitation coil in response to the receipt of said comparator output by said base of said transistor.

8. The apparatus for providing output signals indicative of a direction of a magnetic field to an integrating amplifier of a magnetic direction detecting device according to claim 7, wherein said switching gate comprises Field Effect Transistors having gates, said gates being connected to said comparator to receive said comparator and said switching gate being opened in response to receipt of said comparator output.

* * * * *